United States Patent
Medina

[19]

[11] Patent Number: 5,931,692
[45] Date of Patent: Aug. 3, 1999

[54] CONNECTOR FOR AN ARRAY OF ELECTRICAL CABLES

[75] Inventor: Thomas John Medina, Portland, Oreg.

[73] Assignee: The Whitaker Corporation, Wilmington, Del.

[21] Appl. No.: 08/878,560

[22] Filed: Jun. 19, 1997

Related U.S. Application Data

[60] Provisional application No. 60/020,974, Jun. 28, 1996.

[51] Int. Cl.$^6$ .................................................. H01R 9/07
[52] U.S. Cl. ............................................. 439/497; 29/843
[58] Field of Search ..................... 439/497, 579, 439/63, 581, 92; 29/843, 828, 884; 174/261, 262, 74 R, 35 R

[56] References Cited

U.S. PATENT DOCUMENTS

| | | | |
|---|---|---|---|
| 4,157,612 | 6/1979 | Rainal | 29/828 |
| 4,178,678 | 12/1979 | Carrillo et al. | 29/843 |
| 4,449,778 | 5/1984 | Lane | 29/828 |
| 4,682,828 | 7/1987 | Piper et al. | 439/497 |
| 4,697,339 | 10/1987 | Verhoeven | 29/828 |
| 5,026,291 | 6/1991 | David | 439/67 |
| 5,281,762 | 1/1994 | Long et al. | 174/78 |
| 5,347,711 | 9/1994 | Wheatcraft et al. | 29/843 |
| 5,387,764 | 2/1995 | Blom et al. | 174/261 |
| 5,482,047 | 1/1996 | Nordgren et al. | 128/662.03 |
| 5,710,393 | 1/1998 | Smith et al. | 174/74 R |
| 5,781,991 | 7/1998 | Papon | 29/828 |
| 5,815,916 | 10/1998 | Luc | 29/828 |

*Primary Examiner*—Gary F. Paumen
*Assistant Examiner*—Antoine Ngandjui
*Attorney, Agent, or Firm*—Gerald K. Kita

[57] ABSTRACT

An electrical connector (1) constructed with a carrier (2) on which circuit traces (8) attach to signal transmitting conductors (4) of electrical cables (3), an opening (12) through the carrier (2) at which conductors (4) of the cables (3) project for electrical connection to an electrical circuit positioned at the opening (12), and at least one, or a pair of ground pads (11) on the carrier (2) to reach and connect with a ground portion of the electrical circuit.

15 Claims, 4 Drawing Sheets

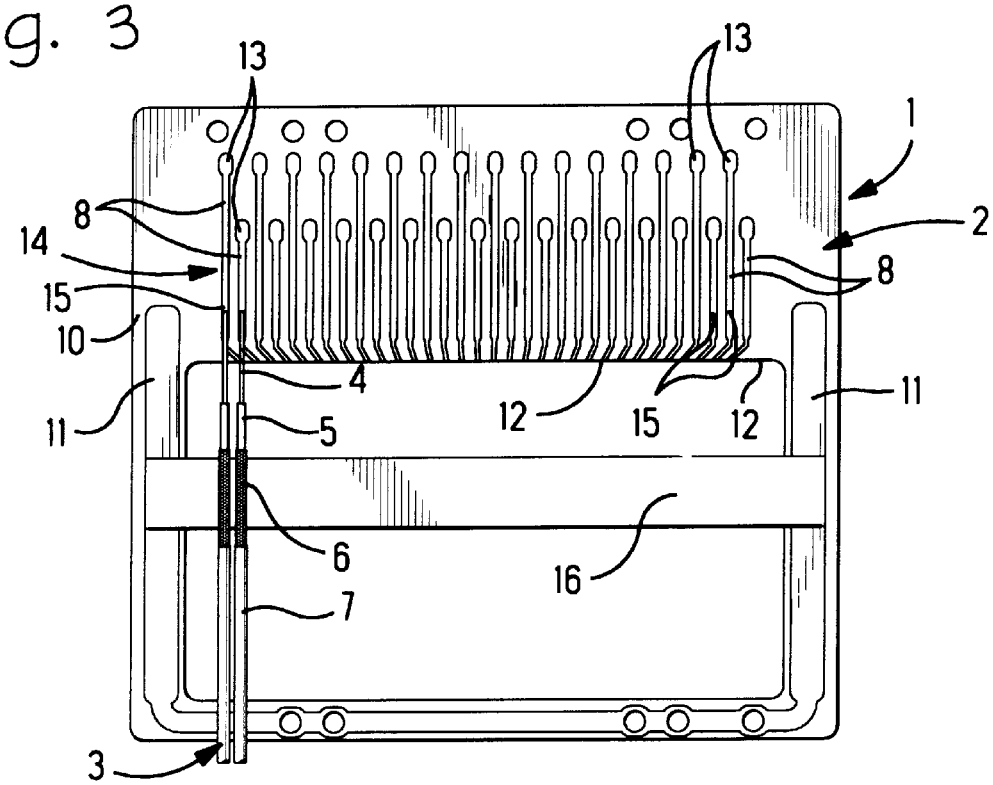
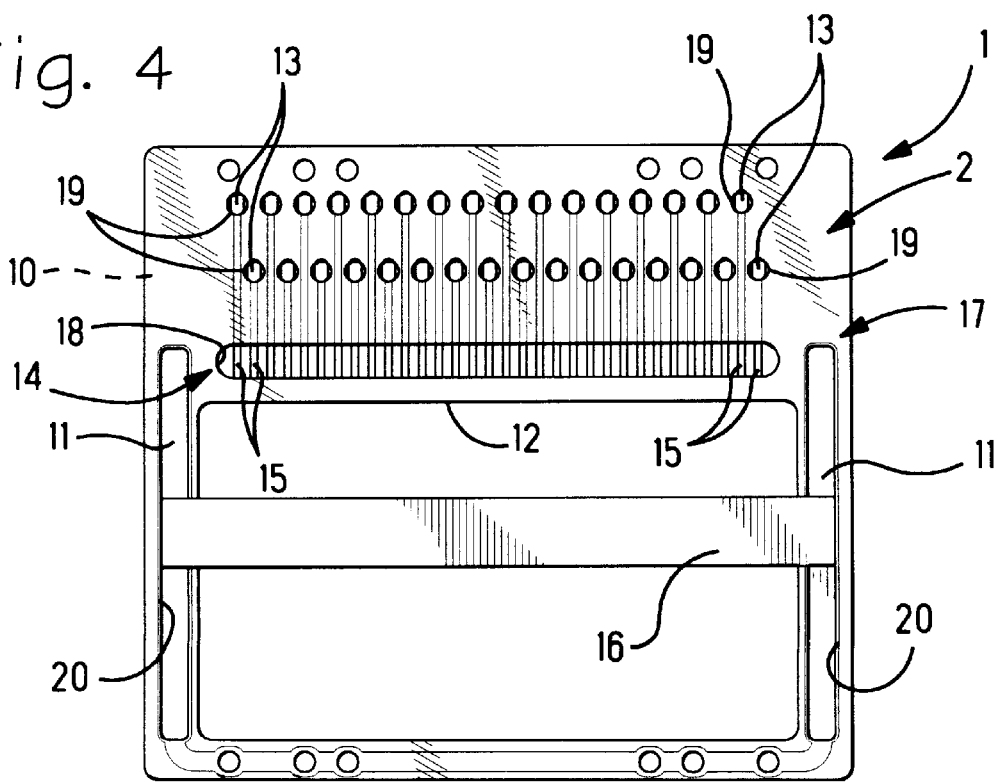

CONNECTOR FOR AN ARRAY OF ELECTRICAL CABLES

This application claims the benefit of U.S. Provisional Application(s) No(s) 60/020,974, filed Jun. 28, 1996.

FIELD OF THE INVENTION

The invention relates to a connector to position an array of multiple electrical cables for connection of the cables to an electrical circuit.

BACKGROUND OF THE INVENTION

U.S. Pat. No. 5,347,711 discloses a connector for positioning an array of multiple electrical cables for connection of the cables to an electrical circuit, wherein the connector comprises, a carrier to which the cables of the array are attached, respective circuit traces on the carrier attached to respective signal transmitting conductors of the cables, and an opening through the carrier at where the signal transmitting conductors project for electrical connection with an electrical circuit positioned at the opening. The patent further describes the opening at where ground conductors of the cables project for connection with a ground portion on the electrical circuit. For example, the ground portion on the electrical circuit can be a ground pad.

The ground portion of the electrical circuit avoids electrical shorting by being spaced apart from other portions of the electrical circuit to which the signal transmitting conductors are to be attached. For different electrical circuits, the corresponding ground portions are at different locations relative to where the signal transmitting conductors are to be attached to the circuits. Accordingly, it has been necessary to manufacture different carriers, for example, carriers with openings at different locations and with different dimensions to align with corresponding ground portions at different locations. A problem resides in having to design and manufacture different carriers to align with such different electrical circuits.

SUMMARY OF THE INVENTION

According to the invention, an electrical connector comprises, a carrier on which circuit traces are positioned to connect with signal transmitting conductors of electrical cables, and at least one elongated ground pad to reach and connect with a ground portion of an electrical circuit, and on which ground pad a ground bus can be attached at a selected location along the ground pad, to align the ground bus with ground conductors of the cables for connection thereto. An advantage resides in a carrier capable of reaching and connecting to a ground portion of an electrical circuit located at different locations, to avoid a need for different carriers.

According to an embodiment, an electrical connector comprises, a carrier on which circuit traces are positioned relative to electrical cables to connect with signal transmitting conductors of the cables, an opening through the carrier at which the signal transmitting conductors project for connection to an electrical circuit that is aligned with the opening, at least one elongated ground pad on the carrier to reach and connect with a ground portion of the electrical circuit, and a ground bus attached at a location that is selected along the ground pad, to align the ground bus with ground conductors of the cables for connection thereto. An advantage resides in at least one ground pad on the carrier locating an attached ground bus to accomplish alignment of the ground bus for connection to ground conductors of electrical cables while circuit traces on the carrier are positioned relative to the cables.

According to an embodiment, an electrical connector comprises, a carrier with at least one ground pad routed along a flexible portion of the carrier to reach and connect with a ground portion on an electrical circuit. An advantage resides in a flexible ground pad to reach and connect with a ground portion of an electrical circuit.

An object of the invention is to provide at least one ground pad on a carrier to accomplish alignment of a ground bus for connection to ground conductors of electrical cables, while circuit traces on the carrier are positioned relative to the cables for connection to signal transmitting conductors of the cables.

Another object of the invention is to provide at least one ground pad on a carrier to accomplish alignment of a ground bus for connection to ground conductors of electrical cables while circuit traces on the carrier are positioned for connection to signal transmitting conductors of the cables.

Other objects and advantages of the invention will become apparent from a following description of the invention. Embodiments of the invention will now be described by way of example with reference to the following drawings, according to which:

DETAILED DESCRIPTION OF THE DRAWINGS

FIG. 3 is a plan view of a carrier attached to electrical cables and a ground bus;

FIG. 4 is a plan view of the carrier as shown in FIG. 3 with the ground bus attached;

DETAILED DESCRIPTION

Figure 1:
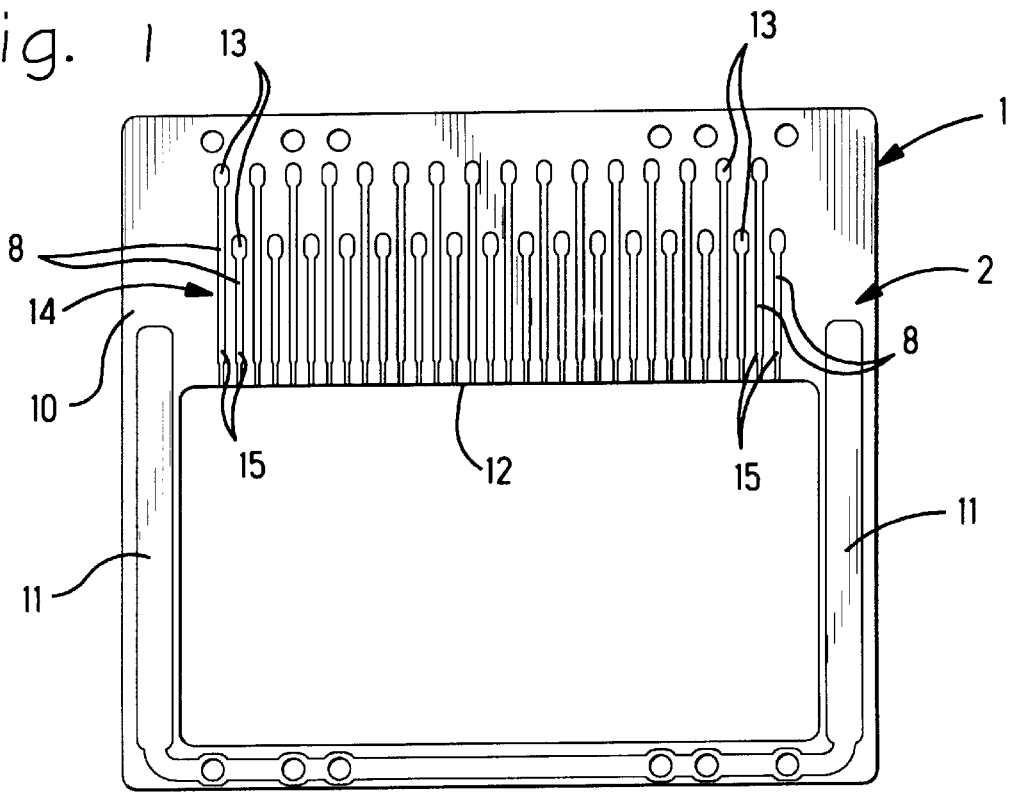
FIG. 1 is a plan view of a carrier, fabricated from a portion of a carrier as shown in FIG. 6, on which are circuit traces to connect with signal transmitting conductors of electrical cables, and at least one elongated ground pad.

With reference to FIG. 3, an electrical connector (1) comprises, a carrier (2) on which multiple electrical cables (3) are positioned. With reference to FIG. 3, each of the cables (3) is constructed of concentric layers, comprising, a central signal transmitting conductor (4) encircled by concentric insulation (5), in turn, encircled by a concentric conducting shield (6), in turn, encircled by an insulating jacket (7). Each layer of the cable (3) is cut to remove a portion of each layer to expose, a short length of the shield (6), a short length of insulation (5) and a short length of the conductor (4), with each short length protruding from a remainder of the cable (3). The cables (3) are utilized in devices including, for example, medical probes that require many such cables (3) to be connected to corresponding electrical circuits. The connector (1) is so constructed and arranged as to position an array of the electrical cables (3) for connection to corresponding electrical circuits in such devices.

Figure 2:
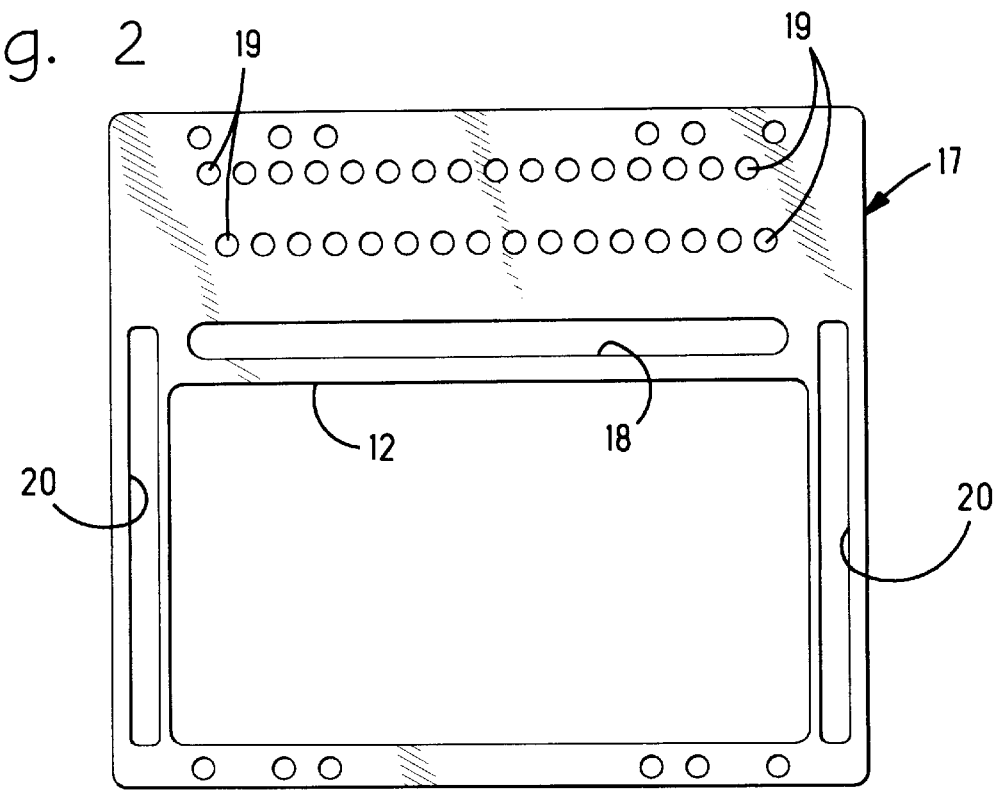
FIG. 2 is a plan view of a portion of a carrier fabricated from a portion of a carrier as shown in FIG. 7, having windows.

The electrical connector (1) provides conducting circuit traces (8) that are positioned to connect with respective signal transmitting conductors (4) of electrical cables (3). With reference to FIGS. 1–3, the electrical connector (1), FIG. 3, comprises, a carrier (2) fabricated by an insulating portion on which are located an array of the conducting circuit traces (8). The insulating portion (10) comprises a layer of thin, flexible material such as KAPTON, a registered trademark of E.I. duPont DeNemours & Co. The circuit traces (8) are narrow conducting circuit paths on the insulating portion (10). In addition to the circuit traces at least one and, more specifically, a pair of, conducting and elongated ground pads (11) are provided on the same side of the insulating portion (10) as the circuit traces (8). For example, the circuit traces (8) and the ground pads (11) are fabricated according to known manufacturing processes for applying conducting paths on a circuit board. Such processes include, additive processes such as plating, or subtractive processes such as etching.

The circuit traces (8) are adjacent one another on the same surface of the insulation layer (10). The circuit traces (8) extend away from an opening (12) through the insulating portion (10) to respective test pads (13) that are provided as enlarged portions on the circuit traces (8). The circuit traces (8) extend toward the opening (12) through the insulating portion (10). In at least one location (14), for example, a location (14) adjacent to the opening (12), portions (15) of the circuit traces (8) are spaced apart on a pitch spacing corresponding to a pitch spacing of the multiple electrical cables (3) that are positioned on the carrier (2). More particularly, the circuit traces (8) and the parallel conductors (4) of the array of cables (3) are on the same corresponding pitch spacing. The portion (15) of the circuit traces (8) are attached by solder joints to respective conductors (4) of the cables (3) in the array. Thereby the traces (8) are joined to respective conductors (4) of the cables (3), and position the conductors (4) on a desired pitch spacing the minimum of which is mandated by the size of the cables in the array.

As shown in FIG. 3, the conductors (4) project away from the circuit traces (8) toward the opening (12), at which opening (12), the conductors (4) project for electrical connection with an electrical circuit positioned at the opening (12). Details of the electrical circuit are disclosed in U.S. Pat. No. 5,347,711, incorporated herein by reference. The opening (12) is positioned relative to the electrical circuit, with the conductors (4) at the opening (12) being positioned adjacent to the electrical circuit. The opening (12) provides a clearance space in which solder joints are fabricated in a known manner as disclosed in U.S. Pat. No. 5,347,711, to attach the conductors (4) to respective portions of the electrical circuit.

Figure 5:
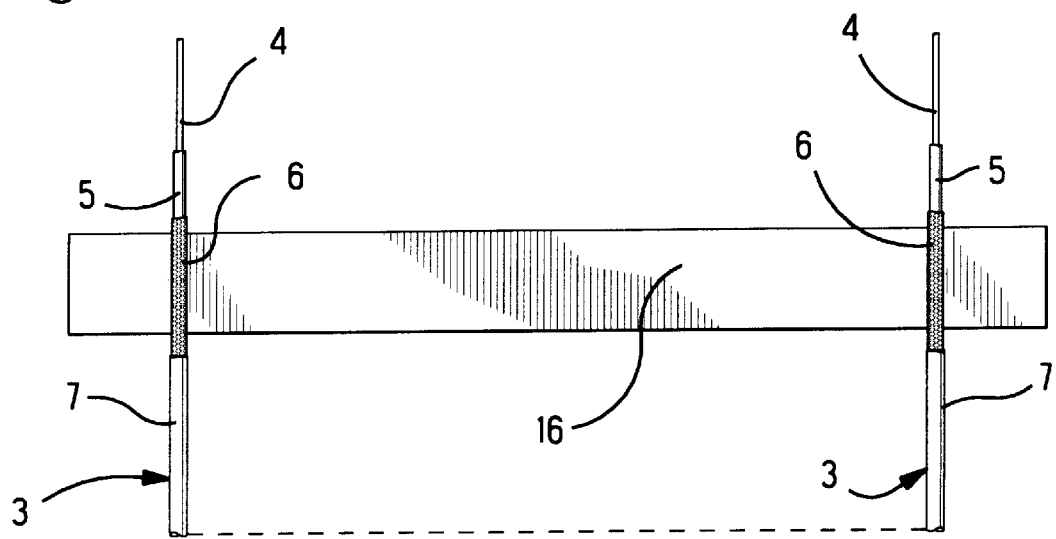
FIG. 5 is a plan view of the cables as shown in FIG. 3 attached to a ground bus.

As shown in FIGS. 3–5, a conducting ground bus (16) is a thin and flexible strip, for example, a strip of thin copper coated with solidified solder that is capable of being reflowed to produce solder joints. The ground bus (16) is separate from the insulating portion (10) of the carrier (2). The ground bus (16) geometry is configured for compatibility with the geometry of the electrical circuit and a circuit board to which the carrier (2) is to be connected. For example, the carrier (2) can connect to an electrical circuit on a front side of a circuit board. The ground bus (16) may extend beyond outer edges of the carrier (2) to become folded around a back side of the circuit board, such that the ground bus (16) may connect to a ground portion of the electrical circuit that extends on a back side of the circuit board, for example, a ground portion in the form of a ground plane on a back side of a circuit board. Further the ground bus (16) extends transversely across the exposed shields (6) of the cables (3) in the array. The exposed shields (6) are side to side in a row along the ground bus (16). The ground bus (16) and the exposed shields (6) are electrically connected by solder joints. The ground bus (16) can be attached, by solder joints, first to one of the ground pads (11), FIG. 4, or first to the shields (6) of the cables (3), FIG. 5.

The ground bus (16) is adjusted in position relative to the carrier (2), as shown in either FIG. 4, or FIGS. 3 and 5 such that the exposed conductors (4) of the cables (3) become substantially aligned with respective circuit traces (8), FIG. 3, for connection thereto afterward by solder joints. If the ground bus (16) has been earlier attached as shown in FIG. 4, for example, by a solder joint to at least one of the ground pads (11) that overlap the ground bus (16), the corresponding solder joint is reflowed to a fluent state to allow repositioning of the ground bus (16).

Each of the ground pads (11) extends near opposite side edges of the opening (12). Each of the ground pads (11) are elongated in the same direction as the axes of the cables (3) in the array. The ground bus (16), alone, or together with the cables (3) having their shields (6) connected to the ground bus (16), can be adjusted in position along each of the elongated ground pads (11), for example, until the exposed central conductors (4) of the cables (3) project a desired amount at the opening (12). Accordingly, each of the lengthy ground pads (11) provides a desired feature that permits adjustment of the cables (3) relative to the opening (12). Once the ground bus (16) is positioned, the ground bus (16) is attached and electrically connected to at least one of the ground pads (11) by a solder joint. Connection to one or both ground pads (11) by solder joints where they overlap the ground bus (16) provides redundant electrical connections and a shorter circuit distance to the electrical circuit for the lengthy ground bus (16). The ground bus (16) is attached to the carrier (2) to anchor the cables (3). For example, the ground bus (16) extends across the opening (12). The conductors (4) of the anchored cables (3) are then straightened and then connected to the circuit traces (8). With the carrier (2) attached to the conductors (4) and to the ground bus (16), the carrier (2) is positioned in proper location over an electrical circuit for connection thereto. For example, the carrier (2) can be turned upside down to face the conductors (4) and the ground pads (11) toward an electrical circuit.

The conductors (4) engage the electrical circuit and can be connected thereto by solder joints. The ground bus (16) can engage a ground portion of the electrical circuit and is readily connected to the ground portion of the electrical circuit as determined by the configuration of the ground bus (16) for compatibility with the electrical circuit. For example, each of the ground pads (11) has a configuration that is capable of reaching and connecting with a ground portion of an electrical circuit located at different locations, to avoid a need for different carriers (2). Further, for example, the ground pads (11) extend on a flexible portion (10) of the carrier (2) that can be flexed, and even doubled back on itself, to face each of the ground pads (11) toward an electrical circuit, and to attach one or both pads (11) to a ground portion of the electrical circuit, at where the corresponding pad (11) reaches to engage the ground portion. At least one of the ground pads (11) can be joined to the ground portion by a solder joint.

When removal and discard of the carrier (2) is desired, following solder attachment of the conductors (4) and at least one of the ground pads (11), care must be taken to cut away each of the solder attached ground pads (11) from a remainder of the carrier (2). The carrier (2) is then easily cut away from the conductors (4) and the solder attached ground pads (11) by a knife or by shears.

When the ground bus (16) as well as the conductors (4) are in correct positions for direct attachment to the electrical circuit, the ground bus (16) can be severed at its opposite ends to detach it from both of the ground pads (11). Latent solder on the ground bus (16) can be reflowed to connect the ground bus (16) and can be reflowed to connect the ground bus (16) to the ground portion of the electrical circuit. The carrier (2) is removed and discarded following solder attachment of the conductors (4) and the ground bus (16) to the electrical circuit.

With reference to FIG. 2, a second insulating portion (17) of the carrier (2) comprises a thin and flexible material provided with a layer of nonconducting adhesive on one side. The second insulating portion (17) is intended to be laminated to the carrier by the adhesive. At least one window (18) through the second insulation portion (17) registers with and exposes the portions (15) of the circuit traces (8) on the desired pitch spacings, FIG. 3. Multiple additional windows (19) through the second insulating portion (17) register with and expose the multiple test pads (13) for connection of test probes. Duplicate opening (12) through the second insulating portion (17) is in registration with the first opening (12). Additional windows (20) through the second insulation portion (17) register with respective ground pads (11). The portions (15) of the circuit traces (8) and the ground pads (11) that are exposed at the windows (18,20) are tinned, meaning that they are coated with solidified solder that can be heated and reflowed to a fluent state to assure proper solder wetting and joining during the formation of solder joints. The second insulation portion (17) provides a protecting cover for the circuit traces (8), and confines the solder within the respective windows (18,20).

Figure 6:
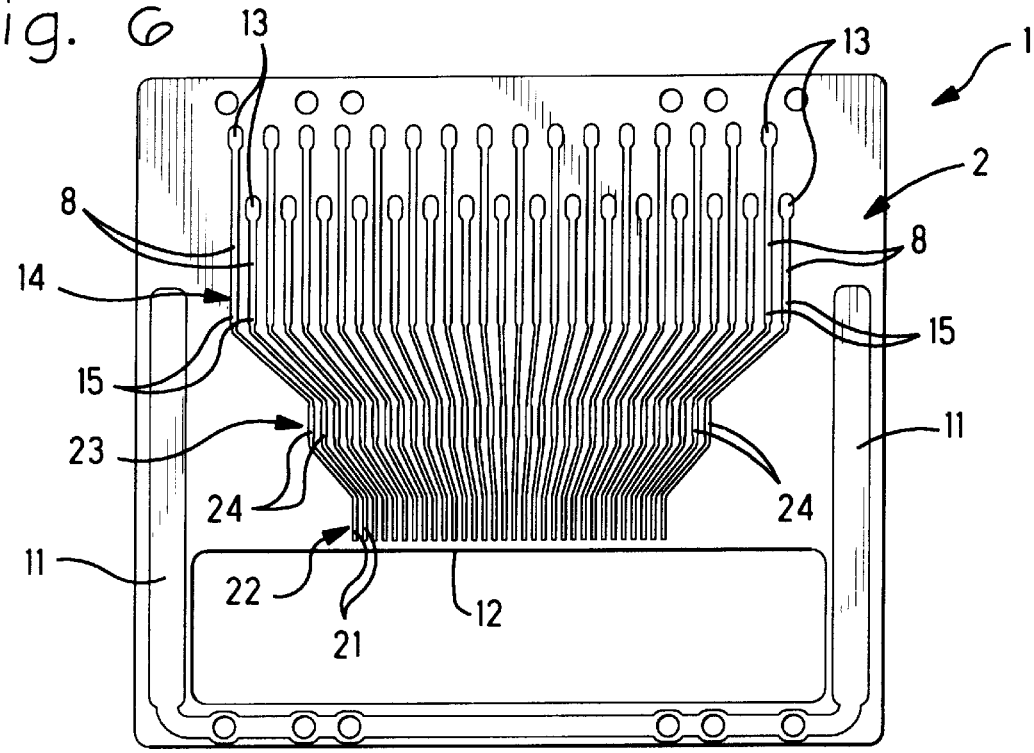
FIG. 6 is a plan view of a carrier, as shown in FIG. 1, together with additional circuit traces.
Figure 7:
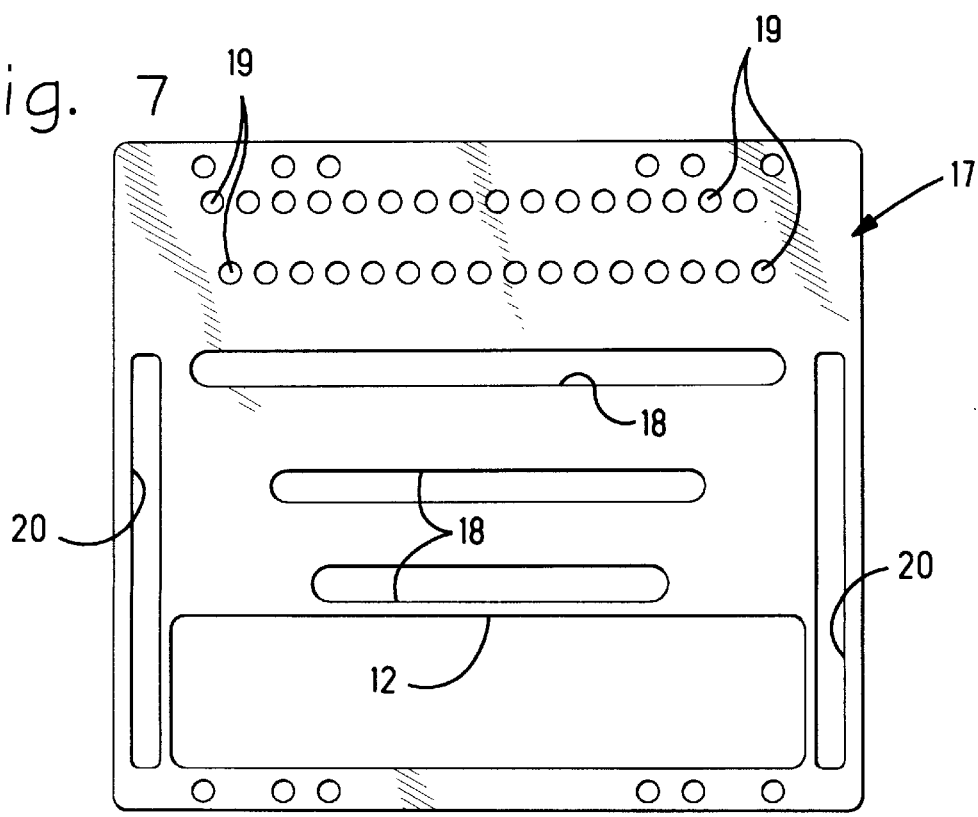
FIG. 7 is a plan view of a portion of the carrier, as shown in FIG. 2, together with additional windows.

With reference to FIGS. 6 and 7, the carrier (2) is larger in initial area than as described in conjunction with FIGS. 1–4. Portions (21) of the circuit traces (8) are at a first location (22) wherein the pitch spacing is narrow. The circuit traces (8) diverge toward at least a second location (23) wherein portions (24) of the traces (8) are on a pitch spacing of intermediate width. The circuit traces (8) diverge toward the location (14) where the portions of the traces (8) are on a wide pitch spacing. The circuit traces (8) provide the locations (14,22,23) for attaching respective cables (3) on different pitch spacings.

Figure 8:
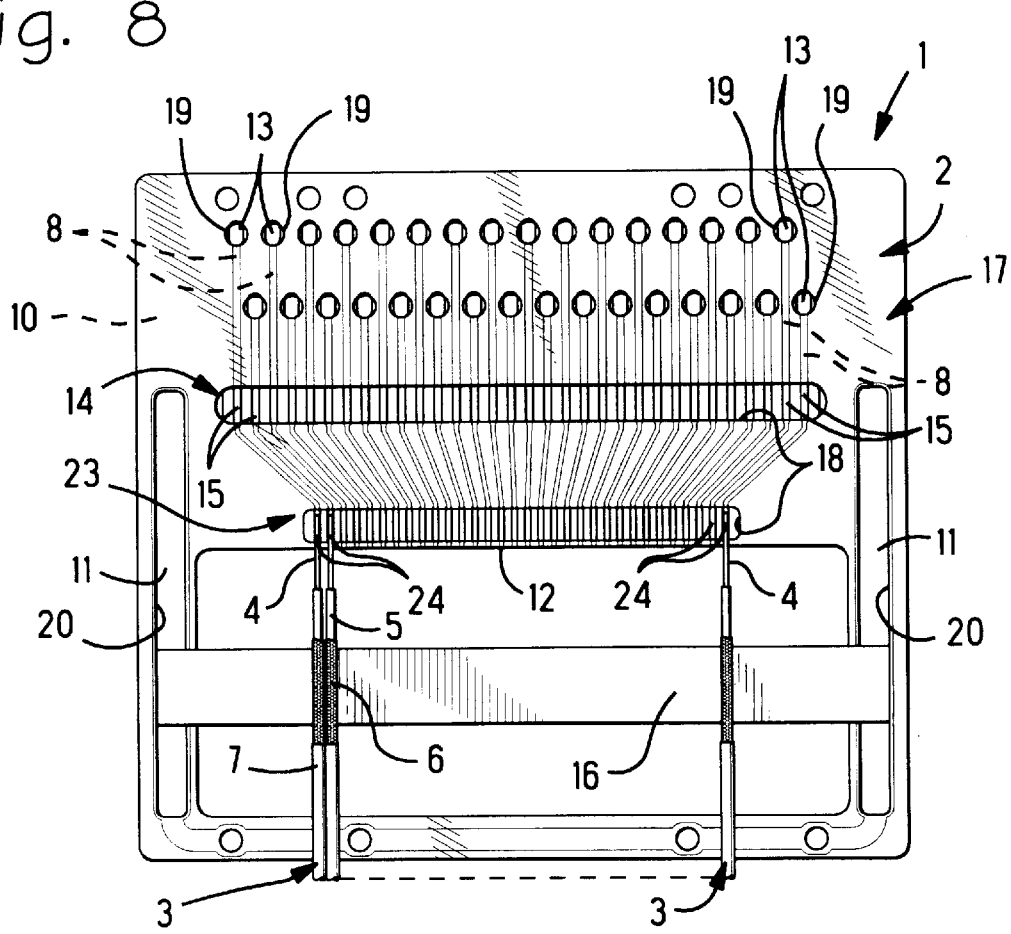
FIG. 8 is a plan view of a portion of a carrier fabricated from a portion of the carrier as shown in FIG. 6, attached to a ground bus and electrical cables.

The carrier (2) as shown in FIG. 1 is obtained from the carrier (2) as shown in FIG. 6, by cutting away a portion of the carrier (2) as shown in FIG. 6, removing the first location (22) and the second location (23), and enlarging the opening (12). Thus, in FIG. 1, the carrier (2) is adapted to attach the cables (3) on a wide pitch spacing. With reference to FIG. 8, the corresponding carrier (2) is obtained from the carrier (2) as shown in FIG. 6, by cutting away a portion of the carrier (2) as shown in FIG. 6, removing the first location (22), enlarging the opening (12) and leaving the second location (23) and the third location (14). Thus, the carrier (2) in FIG. 8 is adapted to attach to the cables (3) on an intermediate width pitch spacing at the second location (23). Thus, the opening (12) is enlarged to position the desired portions (15,21,24) of the circuit traces (8) adjacent to the opening (12). For example, the portion (21) of the circuit traces (8) at location (22) are on a pitch spacing of 0.014 inch and are each 0.006 inch wide. The portions (23) of the circuit traces (8) at location (24) are on a pitch spacing of 0.018 inch and are each 0.008 inch wide. The portion (15) of the circuit traces (8) are on a pitch spacing of 0.025 inch and are each 0.010 inch wide. For example, the conductor (4) of the cables (3) can range from 28 AWG, American Wire Gauge, to 42 AWG. After the conductors (4) are connected by respective solder joints to an electrical circuit that is positioned at the opening (12), distal portions of the conductors (4) that are attached to the circuit traces (8) can be severed and removed from the remainder of the cables (3), together with a part of the carrier (2) on which the circuit traces (8) appear. A remainder of the carrier (2) on which the pads (11) appear can remain.

With reference to FIG. 7, the second insulation portion (17) is larger in initial area than as described in conjunction with FIG. 2, and is provided with multiple separate windows (18) that are in registration with tinned circuit traces at respective locations (14,22,24) for attaching respective cables (3). The second insulation portion (17) can be cut away to remove selected windows (18), so as to adapt the second insulation portion (17) for the carrier (2) as shown in either of FIGS. 1, 6 and 8. The second insulation portion (17) is adapted for being laminated together with the first insulation portion (10), to be followed by cutting away portions of both of them.

Other embodiments and modifications of the invention are intended to be covered by the spirit and scope of the appended claims.

What is claimed is:

1. An electrical connector for connecting respective electrical cables to an electrical circuit, and for connecting a ground bus to a ground portion of the electrical circuit at different locations, comprising:

an insulating flexible carrier for positioning signal transmitting conductors of respective electrical cables for connection to an electrical circuit, the signal transmitting conductors being connected to respective conducting circuit traces on the carrier, the signal transmitting conductors projecting at an opening through the carrier for connection to the electrical circuit, conducting ground pads on the carrier, and a conducting ground bus connected to the conducting shields on respective electrical cables, the ground bus being uninsulated for attachment to the ground pads, the ground bus being attached to the ground pads, the ground bus being uninsulated for direct attachment to a ground portion of the electrical circuit being at a first location, the ground bus being severable from the ground pads when the ground bus is positioned by the carrier for direct attachment to the ground portion of the electrical circuit, and the ground pads being elongated and extending along the carrier to reach and connect with a ground portion of the electrical circuit being at a second, different location, thereby avoiding a need for different carriers.

2. An electrical connector as recited in claim 1 wherein, the ground bus is a thin and flexible strip.

3. An electrical connector as recited in claim 1 wherein, the ground pads extend near opposite side edges of the opening.

4. An electrical connector as recited in claim 1 wherein, the opening is between the ground pads.

5. An electrical connector as recited in claim 1 wherein, the ground pads extend on a flexible portion of the carrier, and the flexible portion of the carrier is flexible to face the ground pads toward a ground portion of the electrical circuit.

6. An electrical connector as recited in claim 1 wherein, a portion of the carrier is removable by severing from the signal transmitting conductors and the ground pads.

7. An electrical connector as recited in claim 1, and further comprising: an insulating portion of the carrier providing a cover for the circuit traces, the insulating portion of the carrier having a window exposing exposed portions of the circuit traces to which the signal transmitting conductors are attached, and the exposed portions of the circuit traces being coated with solder, the insulating portion of the carrier confining the solder within the window.

8. An electrical connector as recited in claim 7 wherein, the insulating portion of the carrier having additional windows exposing exposed portions of the ground pads to which the ground bus is attached, and the exposed portions of the ground pads being coated with additional solder, and the insulating portion of the carrier confining the additional solder within the additional windows.

9. An electrical connector as recited in claim 1 wherein, the circuit traces have a relatively narrow, first pitch spacing and diverge to have a relatively wide, second pitch spacing for attachment thereto of the signal conductors, the circuit traces diverge from the first pitch spacing to have a relatively wide, second pitch spacing for attachment thereto of the signal conductors, and the carrier being severable to enlarge the opening and position the opening adjacent to the circuit traces on the second pitch spacing, whereby the circuit traces match the pitch spacing of the signal transmitting conductors that are attached to said circuit traces.

10. A method for connecting respective electrical cables to an electrical circuit, and for positioning a ground bus for connection to a ground portion of the electrical circuit at different locations, comprising the steps of:

providing conducting circuit traces on an insulating flexible carrier, providing conducting ground pads on the carrier, attaching an uninsulated and conducting ground bus, first to the ground pads, and then to conducting shields of the respective electrical cables, extending signal transmitting conductors of the respective electrical cables over an opening through the carrier, the opening positioning the signal transmitting conductors for connection to an electrical circuit, connecting the signal transmitting conductors to the conducting circuit traces, the ground bus being uninsulated for engaging and direct attachment to a ground portion of the electrical circuit being at a first location, and extending the ground pads along the carrier to reach and connect with the ground portion of the electrical circuit being at a second, different location, thereby avoiding a need for different carriers.

11. A method as recited in claim 10, and further comprising the steps of:

providing the circuit traces with a relatively narrow, first pitch spacing for attachment thereto of the signal transmitting conductors, providing the circuit traces with a relatively wide, second pitch spacing for attachment thereto of the signal conductors, whereby the circuit traces match the pitch spacing of the signal transmitting conductors that are attached to said circuit traces.

12. A method as recited in claim 11, and further comprising the step of:

severing the carrier to enlarge the opening and position the opening adjacent to the circuit traces with the second pitch spacing.

13. A method for connecting respective electrical cables to an electrical circuit, and for positioning a ground bus for connection to a ground portion of the electrical circuit at different locations, comprising the steps of:

providing conducting circuit traces on an insulating flexible carrier, providing conducting ground pads on the carrier, attaching an uninsulated and conducting ground bus, first to conducting shields of the respective electrical cables, and then to the ground pads, extending the signal transmitting conductors over an opening through the carrier for connection to an electrical circuit, connecting the signal transmitting conductors of the respective electrical cables to the conducting circuit traces, the ground bus being uninsulated for engaging and direct attachment to a ground portion of the electrical circuit being at a first location, and extending the ground pads along the carrier to reach and connect with the ground portion of the electrical circuit being located at a second, different location, thereby avoiding a need for different carriers.

14. A method as recited in claim 13, and further comprising the steps of:

providing the circuit traces with a relatively narrow, first pitch spacing for attachment thereto of the signal transmitting conductors, providing the circuit traces with a relatively wide, second pitch spacing for attachment thereto of the signal conductors, whereby the circuit traces match the pitch spacing of the signal transmitting conductors that are attached to said circuit traces.

15. A method as recited in claim 14, and further comprising the step of:

severing the carrier to enlarge the opening and position the opening adjacent to the circuit traces with the second pitch spacing.

* * * * *